(12) United States Patent
Ikarashi et al.

(10) Patent No.: US 10,377,676 B2
(45) Date of Patent: Aug. 13, 2019

(54) RESIN-IMPREGNATED BORON NITRIDE SINTERED BODY AND USE FOR SAME

(71) Applicant: Denka Company Limited, Chuo-ku, Tokyo (JP)

(72) Inventors: Koki Ikarashi, Omuta (JP); Shuhei Nonaka, Omuta (JP); Toshikatsu Mitsunaga, Omuta (JP); Hideki Hirotsuru, Omuta (JP); Mitsuru Shiiba, Omuta (JP)

(73) Assignee: Denka Company Limited, Tokyo (JP)

( * ) Notice: Subject to any disclaimer, the term of this patent is extended or adjusted under 35 U.S.C. 154(b) by 262 days.

(21) Appl. No.: 15/297,722

(22) Filed: Oct. 19, 2016

(65) Prior Publication Data

US 2017/0036963 A1 Feb. 9, 2017

Related U.S. Application Data

(62) Division of application No. 14/895,469, filed as application No. PCT/JP2014/064600 on Jun. 2, 2014, now Pat. No. 10,087,112.

(30) Foreign Application Priority Data

| Jun. 3, 2013 | (JP) | ................................. | 2013-117361 |
| Jun. 3, 2013 | (JP) | ................................. | 2013-117372 |
| Jul. 22, 2013 | (JP) | ................................. | 2013-151974 |

(51) Int. Cl.
| *C04B 35/583* | (2006.01) |
| *C04B 41/00* | (2006.01) |
| *C04B 41/84* | (2006.01) |
| *C04B 41/83* | (2006.01) |
| *C04B 41/48* | (2006.01) |
| *C04B 41/49* | (2006.01) |
| *H01L 23/14* | (2006.01) |
| *H01L 23/373* | (2006.01) |
| *H05K 1/03* | (2006.01) |
| *C04B 111/00* | (2006.01) |

(52) U.S. Cl.
CPC ............ *C04B 41/84* (2013.01); *C04B 35/583* (2013.01); *C04B 41/009* (2013.01); *C04B 41/48* (2013.01); *C04B 41/4853* (2013.01); *C04B 41/4905* (2013.01); *C04B 41/4961* (2013.01); *C04B 41/83* (2013.01); *H01L 23/145* (2013.01); *H01L 23/3737* (2013.01); *H05K 1/0373* (2013.01); *C04B 2111/00844* (2013.01); *C04B 2235/3208* (2013.01); *C04B 2235/386* (2013.01); *C04B 2235/3895* (2013.01); *C04B 2235/5292* (2013.01); *C04B 2235/5436* (2013.01); *C04B 2235/5472* (2013.01); *C04B 2235/787* (2013.01); *C04B 2235/9607* (2013.01); *H01L 2924/0002* (2013.01); *H05K 2201/0209* (2013.01)

(58) Field of Classification Search
CPC .. C04B 35/583; C04B 2235/386; C04B 41/48
See application file for complete search history.

(56) References Cited

U.S. PATENT DOCUMENTS

| 5,531,945 | A | 7/1996 | Ohya |
| 5,854,155 | A | 12/1998 | Kawasaki |
| 6,096,671 | A | 8/2000 | Kawasaki |
| 2003/0164365 | A1 | 9/2003 | Ito et al. |
| 2011/0192588 | A1 | 8/2011 | Suzuki |
| 2012/0067145 | A1 | 3/2012 | Suzuki |

FOREIGN PATENT DOCUMENTS

| CN | 1516524 | A | 7/2004 |
| JP | 62-126694 | A | 6/1987 |
| JP | 1-305861 | A | 12/1989 |
| JP | 2-051471 | A | 2/1990 |
| JP | 5-082760 | A | 4/1993 |
| JP | 5-291706 | A | 11/1993 |
| JP | 6-152086 | A | 5/1994 |

(Continued)

OTHER PUBLICATIONS

Machine translation of JP H07-336001 (Year: 1995).*
Machine translation of JP2007191339 (Year: 2007).*
International Search Report dated Sep. 2, 2014, issued in corresponding International Application No. PCT/JP2014/064600, filed Jun. 2, 2014, 4 pages.
Notice of Second Review of Opinion dated Mar. 8, 2017, issued in corresponding Chinese Application No. 201480031954.7, filed Jun. 2, 2014, 20 pages.

*Primary Examiner* — Wenwen Cai
(74) *Attorney, Agent, or Firm* — Christensen O'Connor Johnson Kindness PLLC

(57) ABSTRACT

A resin-impregnated boron nitride sintered body having superior thermal conductivity and superior strength, and a resin-impregnated boron nitride sintered body having superior conductivity and small anisotropy of thermal conductivity are provided. A resin-impregnated boron nitride sintered body, including: 30 to 90 volume % of a boron nitride sintered body having boron nitride particles bonded three-dimensionally; and 10 to 70 volume % of a resin; wherein the boron nitride sintered body has a porosity of 10 to 70%; the boron nitride particles of the boron nitride sintered body has an average long diameter of 10 µm or more; the boron nitride sintered body has a graphitization index by powder X-ray diffractometry is 4.0 or less; and an orientation degree of the boron nitride particles of the boron nitride sintered body by I.O.P is 0.01 to 0.05 or 20 to 100; and a resin-impregnated boron nitride sintered body, including: 30 to 90 volume % of a boron nitride sintered body having boron nitride particles bonded three-dimensionally is provided.

6 Claims, No Drawings

(56) References Cited

FOREIGN PATENT DOCUMENTS

| | | | |
|---|---|---|---|
| JP | 7-336001 | A | 12/1995 |
| JP | 9-202663 | A | 8/1997 |
| JP | 2002-114596 | A | 4/2002 |
| JP | 2002-212309 | A | 7/2002 |
| JP | 2005-145737 | A | 6/2005 |
| JP | 2007-191339 | A | 8/2007 |
| JP | 2008-248048 | A | 10/2008 |
| JP | 2009-263147 | A | 11/2009 |
| JP | 2010-153538 | A | 7/2010 |
| JP | 2010-275149 | A | 12/2010 |
| JP | 2011-020444 | A | 2/2011 |
| JP | 2012-171842 | A | 9/2012 |
| WO | 2010/047278 | A1 | 4/2010 |

* cited by examiner

RESIN-IMPREGNATED BORON NITRIDE SINTERED BODY AND USE FOR SAME

CROSS-REFERENCE TO RELATED APPLICATION

This application is a division of prior application Ser. No. 14/895,469, filed Jan. 15, 2016, incorporated herein expressly by reference in its entirety.

TECHNICAL FIELD

The present invention is related to a resin-impregnated boron nitride sintered body.

BACKGROUND

Regarding exothermic electronic parts such as power devices, double-side heat dissipation transistors, thyristors, CPU and the like, efficient heat dissipation during their use is important. Generally, conventional measures for such heat dissipation were to (1) improve thermal conductivity of the insulating layer of a printed-wiring board onto which the exothermic electronic parts are to be mounted, and (2) mount the exothermic electronic parts or the printed-wiring board having the exothermic electronic parts mounted thereon onto a heat sink via a thermal interface materials having electric insulation or a ceramics insulating plate. As the insulating layer of the printed-wiring board and the thermal interface materials, heat dissipating member obtained by curing silicone resin and epoxy resin added with ceramics powder is used.

In recent years, higher speed and higher integration of the circuit in the exothermic electronic parts and higher density of the exothermic electronic parts being mounted onto the printed-wiring board have led to higher heat generation density and more precise structure in the electronic devices. Accordingly, heat dissipating member having even higher thermal conductivity has been required.

From the afore-mentioned circumstances, hexagonal boron nitride having superior properties as the electric insulating materials such as (1) high thermal conductivity, (2) high electric insulating property and the like have been receiving attention. However, while the thermal conductivity of boron nitride is 100 to 400 W/(m·K) in the in-plane direction (direction in the a-axis), the thermal conductivity in the thickness direction (direction in the c-axis) is 2 W/(m·K). Accordingly, anisotropy of the thermal conductivity derived from the crystalline structure and the flake shape is large. Accordingly, for example, when the thermal interface materials is manufactured, the in-plane direction (direction in the a-axis) of the boron nitride particle and the thickness direction of the thermal interface materials can come vertical with each other, thereby resulting in cases where the high thermal conductivity of the boron nitride in the in-plane direction (direction in the a-axis) could not be utilized sufficiently.

(First Viewpoint)

High thermal conductivity of the boron nitride particles in the in-plane direction (direction in the a-axis) can be achieved by allowing the in-plane direction (direction in the a axis) of the boron nitride particles and the thickness direction of the thermal interface materials to come in parallel with each other, however, there is a problem in that the material is weak in the tensile stress in the thickness direction.

In Patent Literature 1, a resin composite material containing high rigidity particles such as ceramics and metals by 40 to 90% by volume fraction, the high rigidity particles being in contact with each other three-dimensionally, and a manufacturing method thereof are disclosed. Here, it is also disclosed that such resin composite material can be suitably used in mechanical parts such as a slide member exemplified as a wire saw roller and a gear wheel.

In addition, Patent Literature 2 discloses a sintered ceramics member having at least forsterite and boron nitride as its main component and having boron nitride aligned in one direction, a probe holder formed by using the ceramics member, and a manufacturing method of the ceramics member. Here, it is also disclosed that such ceramics member can be suitably used as a material for a probe holder, into which a probe is inserted. Here, the probe is for a micro contactor used in inspection of semiconductors and liquid crystals, and electrically connects a circuit structure to be inspected and a circuit structure which output signals for inspection.

Patent Literature 3 discloses a method in which a filler having a large anisotropy in shape or in thermal conductivity is mixed and dispersed in a thermosetting resin material, followed by curing of the thermosetting resin. Subsequently, the cured thermosetting resin is crushed, mixed with a thermoplastic resin to obtain a resin composition for a mold, and then the resin composition is heated to soften and mold the resin composition into a desired shape.

Patent Literatures 4 and 5 disclose of a method for manufacturing a substrate for a printed circuit comprising the step of impregnating a thermal setting resin (II) into an inorganic continuous porous body selected from the group consisting of an aluminum nitride-boron nitride composite (AlN-BN), an alumina-boron nitride composite ($Al_2O_3$—BN), a zirconium oxide-boron nitride composite ($ZrO_2$—BN), silicon nitride-boron nitride composite ($Si_3N_4$—BN), hexagonal boron nitride (h-BN), β-wollastonite (β-$CaSiO_3$), mica, and volcanic soil; followed by curing to obtain a cured plate body. In addition, it is also disclosed that such substrate for a printed circuit can be suitably used as a substrate for high frequency usage and for directly mounting a semiconductor chip.

Patent Literature 6 discloses a porous body of B-C-N system having a graphite three-dimensional skeletal structure synthesized from a porous polyimide sheet as a starting material, and a heat dissipating material obtained by impregnating a resin in the porous portion to obtain a composite material. Such heat dissipating material has a smaller heat resistance compared with those obtained by impregnating a resin in an ordinary carbon porous body, and an insulating composite material can be obtained by the conversion of the porous body into h-BN. Accordingly, the heat dissipating material is a promising material as a cooling material for electronic parts which require low heat resistance and electric insulating property.

(Second Viewpoint)

In addition, not only the heat dissipation in one direction of the thickness direction or the plane direction as conventionally required, but also high heat dissipation in both of the thickness direction and the plane direction is required.

Patent Literature 7 discloses a substrate for an electronic circuit comprising a ceramics composite obtained by filling a resin in open pores of a porous ceramics sintered body, the porous ceramics sintered body having a three-dimensional network crystalline structure. Here, the porous ceramics sintered body is structured with a ceramics material of which crystal grains have an average crystalline grain diameter of 10 μm or less. However, it is difficult to align the flake-like boron nitride particles randomly with the method of Patent Literature 7. Accordingly, anisotropy of thermal conductivity could not be decreased.

When the method of Patent Literature 2 was used, the orientation degree of the flake-like boron nitride was large, showing I.O.P (The Index of Orientation Performance) of 0.07 or lower. Accordingly, the anisotropy of thermal conductivity could not be decreased.

In the method of Patent Literature 3, thermal conductivity was low as showing a maximum value of 5.8 W/(m·K). In addition, the thermosetting resin needs to be crushed after being obtained, and then the thermosetting resin is mixed and softened again. Accordingly, it was problematic in the viewpoint of reliability due to the possibility of contamination and uniformity of the softening condition of the resin.

Patent Literature 8 discloses of increasing the temperature of the mold when the resin molding is performed, thereby making random the direction of heat dissipation of the inorganic filler. However, in the method of Patent Literature 8, alignment of the inorganic filler can be controlled only insufficiently, and thus the decrease in the anisotropy of the thermal conductivity was insufficient.

Patent Literature 9 discloses of a method in which the manufacturing conditions of the boron nitride is adjusted to allow the flake-like boron nitride to aggregate, thereby obtaining a pinecone-like boron nitride powder. However, in the method of Patent Literature 9, the pinecone-like aggregated particles of the boron nitride would partly align during the coating process and the heat-pressing process performed in the processes to manufacture a thermoconductive sheet, and thus the decrease in the anisotropy of the thermal conductivity was insufficient.

Patent Literature 10 discloses of impregnating a ceramics powder slurry in a boron nitride sintered body and a composite sintered body, thereby achieving dust free properties. However, since the boron nitride sintered body and the composite sintered body of Patent Literature 10 are manufactured generally by powder molding or hot press, alignment of boron nitride cannot be avoided, and thus there was anisotropy in the thermal conductivity.

Patent Literature 11 discloses a thermoconductive sheet comprising plate-like boron nitride particles and an organic polymer compound having a glass transition temperature (Tg) of 50° C. or lower; the plate-like boron nitride particles being aligned in the direction of longitudinal axis thereof with respect to the thickness direction of the sheet. Here, regarding the thermoconductive sheet obtained by the method of Patent Literature 11, although the thermal conductivity of the thermoconductive sheet in the thickness direction is as high as 26.9 W/(mK) at maximum, the plate-like boron nitride particles are aligned, and thus there was anisotropy in the thermal conductivity.

In the conventional technique, the heat dissipating member is manufactured via a mixing process to mix the ceramics powder such as boron nitride and the resin, an extrusion molding process, a coating process, a heating process and the like. Therefore, it is difficult to avoid the alignment of the boron nitride crystals. Accordingly, the decrease in the thermal conductivity was limited. The issue of alignment can be suppressed when spherical particles of aluminum oxide powders and silicon oxide powders are used, however, thermal conductivity of these ceramics powders is approximately 20 to 30 W/(m·K) and is lower than that of boron nitride. In addition, since the particles are hard, there was a problem in that the apparatus and the mold would be worn down. Further, in the heat dissipating member manufactured by conventional technique, thermoconductive fillers such as boron nitride were added in the form of powders, and thus it was necessary to increase the filling amount of the thermoconductive fillers up to approximately 60% by volume. However, such technique would raise the cost, and the thermal conductivity of the heat dissipating member was 6 W/(m·K) or lower, resulting in difficulty in meeting the recent demands for higher thermal conductivity.

In the electronic parts using the heat dissipating member, when the heat dissipating member is a conventional one having large anisotropy in thermal conductivity, the arrangement of the cooling unit and the heat transport unit would be limited, thereby resulting in cases where further miniaturization of the electronic device becomes difficult. Accordingly, development of a dissipating member having superior thermal conductivity and small anisotropy in the thermal conductivity is strongly desired.

Regarding these problems, a heat dissipating member having superior thermal conductivity and small anisotropy in the thermal conductivity can be manufactured by using a resin-impregnated boron nitride sintered body containing a resin. Here, in the boron nitride sintered body, flake-like boron nitride particles having a specific calcium content ratio, specific graphitization index of the boron nitride, and suitably controlled average grain size are allowed to have a three-dimensional bonding with small orientation degree in the boron nitride crystals, thereby enhancing the accessibility among the boron nitride particles. However, there has been no technical suggestion provided in these points of views.

CITATION LIST

Patent Literature

[Patent Literature 1] JP 2002-212309A
[Patent Literature 2] JP 2010-275149A
[Patent Literature 3] JP 2008-248048A
[Patent Literature 4] JP H5-291706A
[Patent Literature 5] JP H6-152086A
[Patent Literature 6] JP 2010-153538A
[Patent Literature 7] JP H5-82760B
[Patent Literature 8] JP 2011-20444A
[Patent Literature 9] JP H9-202663A
[Patent Literature 10] JP 2009-263147A
[Patent Literature 11] WO2010/047278

Technical Problem (First Viewpoint)

However, although the method of Patent Literature 1 improves abrasion resistance and electric insulation by impregnating the resin into the molding having ceramics and metal contacting each other three-dimensionally, improvement in thermal conductivity was not sufficient.

In Patent Literature 2, a ceramics member as a sintered body containing at least one of forsterite and boron nitride as the main component, and having the boron nitride aligned in one direction; a probe holder formed by using the ceramics member; and a manufacturing method of the ceramics member are suggested. Here, a ceramics member having free-cutting property as well as thermal expansion coefficient close to that of silicone, and high strength is suggested, however, improvement in the thermal conductivity was not sufficient.

In the method of Patent Literature 3, thermal conductivity was low as showing a maximum value of 5.8 W/(m·K). In addition, the thermosetting resin needs to be crushed after being obtained, and then the thermosetting resin is mixed and softened again. Accordingly, it was problematic in the viewpoint of reliability due to the possibility of contamination and uniformity of the softening condition of the resin.

In the methods of Patent Literatures 4 and 5, there is no disclosure regarding the impregnation of the resin into the boron nitride sintered body simple substance, and thus the bending strength is as low as 28 MPa, even though the maximum thermal conductivity is 45 W/(m·K). Therefore, it is difficult realize high thermal conductivity and high strength.

In Patent Literature 6, the thickness of the sheet was 100 μm or less, and thus there was a problem in the viewpoint of reliability due to the uniformity of the softening condition of the resin and the boron nitride in the moisture-resistant condition.

In the conventional technique, the heat dissipating member is manufactured via a mixing process to mix the ceramics powder such as boron nitride and the resin, an extrusion molding process, a coating process, a heating process and the like. Therefore, it is difficult to obtain a structure having the boron nitride crystals contacting with each other three-dimensionally. Accordingly, there was a limit in the improvement in the thermal conductivity. In addition, even when spherical particles of aluminum oxide powders and silicon oxide powders are used, thermal conductivity of these ceramics powders is approximately 20 to 30 W/(m·K) and is lower than that of boron nitride. Further, since the particles are hard, there was a problem in that the apparatus and the mold would be worn down. In addition, in the heat dissipating member manufactured by the conventional technique, the filling amount of the ceramics powder such as the boron nitride needs to be increased up to approximately 60 mass % in order to increase the thermal conductivity, however, since such technique would increase the cost, it was difficult to achieve both of low cost and superior property with the heat dissipating member. Here, a method for manufacturing a circuit substrate having superior workability and strength by allowing a resin to impregnate in a ceramics of which crystal grains are bonded in a three-dimensional network structure and has open pores, is conventionally known. However, although there is a disclosure that boron nitride and the like is added to provide thermal conductivity, it was difficult to realize high thermal conductivity and bending strength.

Regarding these problems, the present invention places importance in the heat dissipating property, and improves thermal conductivity and strength by obtaining a composite material. Specifically, the inner gap of the boron nitride sintered body is impregnated with a resin, and then the impregnated boron nitride sintered body is cut into plates to manufacture the heat dissipating member. Accordingly, the alignment can be controlled in an arbitrary direction, and a heat dissipating member having superior thermal conductivity with arbitrary thickness can be manufactured easily. Therefore, a heat dissipating member which can obtain high reliability with respect to moisture and thermal cycle can be manufactured. In addition, even when the filling amount of the boron nitride is relatively small, the structure having the boron nitride contacting with each other three-dimensionally allows manufacture of a heat dissipating member having superior thermal conductivity. However, there has been no technical suggestion provided in these points of views.

The present invention provides a heat dissipating member having superior thermal conductivity and strength, which is suitably used as a heat dissipating member of exothermic electronic parts such as power devices and the like, especially used for insulating layer of a printed-wiring board, thermal interface materials and double-side heat dissipating power modules for automobiles.

(Second Viewpoint)

The present invention provides a resin-impregnated boron nitride sintered body having superior thermal conductivity and small anisotropy of thermal conductivity, which is suitably used as a heat dissipating member of exothermic electronic parts such as power devices and the like, especially used for insulating layer of a printed-wiring board, thermal interface materials, substrates for power modules, and double-side heat dissipating power modules for automobiles.

Solution to Problem

The afore-mentioned problems can be solved by at least one of the first and the second viewpoints of the present invention described below. The features described for the first and the second viewpoints can be combined with each other, and such combination can achieve further superior effects. The object and the effect of the first viewpoint can be achieved by the feature of the first viewpoint of the present invention, and the object and the effect of the second viewpoint can be achieved by the feature of the second viewpoint of the present invention.

(First Viewpoint)

In order to solve the afore-mentioned problems, the present invention adopts the following measures.

(1) A resin-impregnated boron nitride sintered body, comprising: 30 to 90 volume % of a boron nitride sintered body having boron nitride particles bonded three-dimensionally; and 10 to 70 volume % of a resin; wherein the boron nitride sintered body has a porosity of 10 to 70%; the boron nitride particles of the boron nitride sintered body has an average long diameter of 10 μm or more; the boron nitride sintered body has a graphitization index (GI) by powder X-ray diffractometry is 4.0 or less; and an orientation degree of the boron nitride particles of the boron nitride sintered body by I.O.P (The Index of Orientation Performance) provided by the following equation is 0.01 to 0.05 or 20 to 100.

I.O.P. is calculated from an intensity ratio of (100) diffraction line with respect to (002) diffraction line measured from a direction parallel to a height direction of the boron nitride sintered body and an intensity ratio of (100) diffraction line with respect to (002) diffraction line measured from a direction perpendicular to the height direction of the sintered body, using the following equation.

$$\text{I.O.P} = (I100/I002)\text{par.}/(I100/I002)\text{prep.}$$

(2) The resin-impregnated boron nitride sintered body of (1), wherein a shore hardness measured with respect to the height direction of the resin-impregnated boron nitride sintered body is 25HS or lower.

(3) The resin-impregnated boron nitride sintered body of (1) or (2), wherein: a 100 plane (a-axis) of the boron nitride particle is aligned with respect to the height direction of the boron nitride sintered body having boron nitride particles bonded three-dimensionally; a three-point bending strength measured with respect to the height direction of the boron nitride sintered body is 3 to 15 MPa; and a thermal conductivity measured from the height direction of the boron nitride sintered body is 40 to 110 W/(m·K).

(4) The resin-impregnated boron nitride sintered body of (1) or (2), wherein: a 002 plane (c-axis) of the boron nitride particle is aligned with respect to the height direction of the boron nitride sintered body having boron nitride particles bonded three-dimensionally; a three-point bending strength measured with respect to the height direction of the boron nitride sintered body is 10 to 40 MPa; and a thermal conductivity measured from the height direction of the boron nitride sintered body is 10 to 40 W/(m·K).

(Second Viewpoint)

In order to solve the afore-mentioned problems, the present invention adopts the following measures.

(5) A resin-impregnated boron nitride sintered body, comprising: 30 to 90 volume % of a boron nitride sintered body having boron nitride particles bonded three-dimensionally; and 10 to 70 volume % of a resin; wherein: the boron nitride sintered body has a calcium content of 500 to 5000 ppm; the boron nitride sintered body has a graphitization index (GI) by powder X-ray diffractometry of 0.8 to 4.0; the boron nitride sintered body comprises flake-like boron nitride particles having an average long diameter of 10 μm or more; and an orientation degree by I.O.P (The Index of Orientation Performance) provided by the following equation is 0.6 to 1.4, the orientation degree obtained from an intensity ratio of (100) diffraction line with respect to (002) diffraction line measured from a direction parallel to a height direction of the boron nitride sintered body and an intensity ratio of (100) diffraction line with respect to (002) diffraction line measured from a direction perpendicular to the height direction of the sintered body, using the following equation.

I.O.P=($I$100/$I$002)par./($I$100/$I$002)prep.

(6) The resin-impregnated boron nitride sintered body of (5), wherein: the boron nitride sintered body having the boron nitride particles bonded three-dimensionally has a three-point bending strength of 5 to 40 MPa, a thermal conductivity of 5 W/(m·K) or more, and a total porosity of 70% or less.

(Common Items)

(7) The resin-impregnated boron nitride sintered body of any one of (1) to (6), wherein the resin is a thermosetting resin.

(8) A heat dissipating member using the resin-impregnated boron nitride sintered body of any one of (1) to (7).

(9) A substrate for power module using the heat dissipating member of (8).

(10) A double-side heat dissipating power module for automobiles using the heat dissipating member of (8).

Advantageous Effects of Invention

From the first viewpoint of the present invention, the effect of obtaining a heat dissipating member having superior thermal conductivity and strength can be achieved.

From the second viewpoint of the present invention, the effect of obtaining a heat dissipating member using a resin-impregnated boron nitride sintered body having superior thermal conductivity and small anisotropy of thermal conductivity can be achieved.

DESCRIPTION OF EMBODIMENTS

Hereinafter, embodiments of the present invention will be described. The first and the second viewpoints are explained separately, however, an embodiment having the features of both of the first and the second viewpoints can be realized. In the following explanation, the common features of the first and the second viewpoints will be explained in the first viewpoint, and the explanation will not be repeated in the second viewpoint. Accordingly, the features explained in the first viewpoint can be applied to the second viewpoint, unless it deviate the spirit thereof.

In the present invention, "boron nitride particles" is defined as the primary particles of boron nitride, "boron nitride sintered body" is defined as a condition in which two or more of the primary particles are bonded by sintering, "resin-impregnated boron nitride sintered body" is defined as a composite comprising the boron nitride sintered body and a resin, and "boron nitride molded body" is defined as the mold obtained by calcifying the resin of the resin-impregnated boron nitride sintered body. The boron nitride molded body can be obtained by calcifying the resin component by calcinating the resin-impregnated boron nitride sintered body in the atmosphere at 650 to 1000° C. for 1 hour. The bond formed by the sinteration can be evaluated by observing the bonded portion between the primary particles at the cross-section of the boron nitride particles using a scanning type electronic microscope (for example, "JSM-6010LA" (available from JEOL Ltd.)). As a preliminary treatment before the observation, the boron nitride particles were embedded in a resin, followed by processing by CP (cross section polisher) method. Then, the particles were fixed on a sample stage, followed by osmium coating. Observation was carried out with a magnification of 1000 or 1500.

(First Viewpoint)

The heat dissipating member using the resin-impregnated boron nitride sintered body according to the first viewpoint of the present invention has an orientation degree shown by a specific I.O.P (The Index of Orientation Performance), and is obtained by impregnating a specific amount of resin into a boron nitride sintered body, the boron nitride particle of the boron nitride sintered body having a controlled average long diameter. Accordingly, the heat dissipating member having superior thermal conductivity and strength which cannot be realized by the conventional technique can be realized.

The boron nitride sintered body according to the first viewpoint of the present invention has an orientation degree represented by I.O.P (The Index of Orientation Performance) of 0.01 to 0.05 or 20 to 100, a graphitization index (GI) obtained by the powder X-ray diffraction method of 4.0 or lower, and a porosity of 10 to 70%. In addition, the boron nitride sintered body is structured with a boron nitride having a three-dimensionally bonded boron nitride particles with an average long diameter of 10 μm or more. The boron nitride sintered body designed as such did not exist to date, and is a very important factor to retain high thermal conductivity and high strength.

In addition, controlling of the shore hardness of the resin-impregnated boron nitride sintered body to 25HS or lower allows achievement of superior toughness and decrease in the thermal resistance without using grease even under loaded environment.

The major difference compared with the conventional technique is that the resin-impregnated boron nitride sintered body according to the first viewpoint of the present invention is structured with a boron nitride sintered body obtained as boron nitride particles bonded three-dimensionally by sintering. The three-dimensional bonding is not a simple contact which can be observed by SEM and the like, but can be evaluated by measuring the three-point bending strength and the thermal conductivity of the boron nitride molded body obtained by calcifying the resin component of the resin-impregnated boron nitride sintered body. In the conventional resin-impregnated boron nitride sintered body manufactured by mixing the boron nitride powder and the resin, the three-dimensional bond among the boron nitride is weak, and thus the boron nitride remaining after calcifying would be powdered and cannot maintain a shape, or cannot satisfy the required properties of the three-point bending strength and the thermal conductivity even when the shape is maintained.

<Average Long Diameter>

The average long diameter of the boron nitride particles in the boron nitride sintered body of the present invention is 10 μm or more. When the average long diameter is less than 10 μm, the pore size of the boron nitride sintered body would become small, resulting in incomplete impregnation of the resin. Accordingly, although the strength of the boron nitride sintered body itself can be improved, the effect of improving the strength by the resin would become small, and the strength as the resin-impregnated boron nitride sintered body would decrease. In addition, the number of contacting points among the flake-like boron nitride particles would increase, thereby resulting in decrease in the thermal conductivity of the resin-impregnated boron nitride sintered body. There is no particular limitation regarding the upper limit of the average long diameter. Since it is difficult for the flake-like boron nitride particles to have an average long diameter of 50 μm or more, upper limit of the average long diameter is approximately 50 μm in reality.

<Definition and Evaluation Method of Average Long Diameter>

The average long diameter can be measured in the following manner. As a preliminary treatment before the observation, the boron nitride sintered body is embedded in a resin, followed by processing by CP (cross section polisher) method. Then, the boron nitride sintered body was fixed on a sample stage, followed by osmium coating. Then, SEM image is taken with a scanning type electronic microscope (for example, "JSM-6010LA" (available from JEOL Ltd.)), and the image of the particles at the cross section is imported into an image analysis software, for example "A-ZO KUN" (available from Asahi Kasei Engineering Corporation) or "Mac-View Ver. 4.0" (available from Mountech Co., Ltd.). The magnification of the image was 1000, and the pixel number of image analysis was $1510 \times 10^4$ pixel. Long diameter was manually measured for arbitrary 100 particles obtained, and the average value was taken as the average long diameter.

Measurement was conducted with the boron nitride molded body in a similar manner.

<Porosity and Evaluation Method Thereof>

From the viewpoint of electric insulation and thermal conductivity of the resin-impregnated boron nitride sintered body, it is preferable that boron nitride particles are contained by 30 to 90 volume % and the boron nitride particles have a three-dimensional bonding structure in the boron nitride sintered body of the present invention. Porosity is preferably 70% or lower, more preferably 50% or lower. The porosity in such range is preferable for improving the thermal conductivity of the resin-impregnated boron nitride sintered body. In addition, in order to improve strength sufficiently by resin impregnation, the porosity is preferably 10% or higher. Measurement of the porosity of the boron nitride sintered body can be obtained by the following equation from the bulk density (D) obtained from the size and mass of the boron nitride sintered body and theoretical density of the boron nitride (2.28 g/cm³). Measurement for the boron nitride molded body was conducted in a similar manner.

bulk density$(D)$=mass/volume porosity of boron nitride sintered body=1−$(D/2.28)$ Porosity can be adjusted by the pressure applied when an isotropic pressure is applied to the boron nitrides intered body.

<Orientation Degree>

In the boron nitride sintered body of the first viewpoint of the present invention, the orientation degree represented by I.O.P (The Index of Orientation Performance) is in the range of 0.01 to 0.05 or 20 to 100. When I.O.P. is out of the range of 0.01 to 0.05 or 20 to 100, the boron nitride crystals in the boron nitride sintered body is in the state of non-aligned condition. Accordingly, the anisotropy of the thermal conductivity would become small and it would become difficult to obtain superior thermal conductivity in the arbitrary direction with the resin-impregnated boron nitride sintered body. Orientation degree can be controlled by the formulation amount of the amorphous boron nitride powder and the hexagonal boron nitride powder particles as the raw material or by the molding method.

<Definition of Orientation Degree and Evaluation Method Thereof>

I.O.P. of the boron nitride crystal can be calculated from the intensity ratio of (100) diffraction line with respect to (002) diffraction line measured from a direction parallel to the height direction of the boron nitride sintered body and the intensity ratio of (100) diffraction line with respect to (002) diffraction line measured from a direction perpendicular to the height direction of the boron nitride sintered body, using the following equation.

I.O.P=$(I100/I002)$par./$(I100/I002)$prep.

When I.O.P=1 is satisfied, it means that the direction of the boron nitride crystals in the sample is random. The value of I.O.P. being smaller than 1 indicates that the (100) plane of the boron nitride crystal in the boron nitride sintered body, that is, the a-axis of the boron nitride crystal is aligned perpendicularly with the height direction. On the other hand, the value of I.O.P. exceeding 1 indicates that the (100) plane of the boron nitride crystal in the boron nitride sintered body, that is, the a-axis of the boron nitride crystal is aligned parallel with the height direction. Measurement of I.O.P can be conducted by using "D8ADVANCE Super Speed" (available from Bruker AXS K.K.) for example. Measurement was conducted using CuKα ray as the X-ray source, the X-ray tube voltage was 45 kV, and the X-ray tube current was 360 mA.

Measurement was conducted with the boron nitride molded body in a similar manner.

<Graphitization Index (GI)>

Graphitization index (GI) can be obtained from the following equation using the integrated intensity ratio, that is, the area ratio of (100) plane, (101) plane, and (102) plane of the X-ray diffraction diagram {J. Thomas, et. al, J. Am. Chem. Soc. 64, 4619 (1962)}.

GI=[area{(100)+(101)}]/[area(102)]

Here, it is generally known that GI of fully crystallized boron nitride is 1.60. In the case of a flake-like hexagonal boron nitride powder having high crystallinity with sufficiently grown particles, GI becomes more smaller since the particles tend to align. That is, GI is an index of the crystallinity of the flake-like hexagonal boron nitride powder, and the smaller the value, the higher the crystallinity. In the boron nitride molded body of the present invention, GI is preferably 4.0 or lower. The value of GI being higher than 4.0 indicates that the crystallinity of the boron nitride primary particle is low, and thus the thermal conductivity of the boron nitride sintered body decreases. Here, when it is necessary to decrease the anisotropy of thermal conductivity, GI is preferably 0.8 or higher. The value of GI being lower than 0.8 indicates that the crystallinity of the boron nitride primary particle is high. Since the flake-like shape of the boron nitride primary particle is excessively developed, the anisotropy of thermal conductivity with respect to the resin-impregnated boron nitride sintered body becomes large. GI can be controlled by the formulation amount of the hexagonal boron nitride powder particles as the raw material, addition amount of calcium compound, and calcination temperature.

<Evaluation Method of Graphitization Index (GI)>

Measurement of GI can be conducted by using "D8ADVANCE Super Speed" (available from Bruker AXS K.K.) for example. As a preliminary treatment before the measurement, the boron nitride sintered body is crushed using an agate mortar, and then the boron nitride powder thus obtained was subjected to press molding. X-ray was irradiated symmetrically with respect to the normal vector of the plane in the in-plane direction of the mold. Measurement was conducted with CuKα ray as the X-ray source, the X-ray tube voltage was 45 kV, and the X-ray tube current was 360 mA.

Measurement was conducted with the boron nitride molded body in a similar manner.

<Bending Strength>

Three-point bending strength was used as the strength of the boron nitride sintered body structuring the resin-impregnated boron nitride sintered body of the present invention. The three-point bending strength is preferably 3 to 40 MPa, and more preferably 5 to 40 MPa. When the three-point bending strength is lower than 3 MPa or 5 MPa, the three-dimensional bonding area among the boron nitride particles would be small, and the thermal conductivity of the resin-impregnated boron nitride sintered body becomes low as a result. In addition, it can cause destruction of the heat dissipating material when mounted, resulting in decrease in the electric insulation and decrease in reliability. On the other hand, the three-point bending strength being higher than 40 MPa indicates that the bonding area among the boron nitride particles is large, and thus the porosity of the boron nitride sintered body decreases. Accordingly, it becomes difficult to impregnate the resin fully into the boron nitride sintered body, resulting in decrease in the strength and in the electric insulation of the resin-impregnated boron nitride sintered body. Bending strength can be adjusted by the addition amount of calcium compound, calcination temperature when the boron nitride sintered body is prepared, and the pressure when isotropic pressure is applied.

When the 100 plane (a-axis) of the boron nitride particle is aligned with respect to the height direction of the boron nitride sintered body, it is further preferable that the bending strength measured from the height direction of the boron nitride sintered body is 3 to 15 MPa. Here, it is preferable that the thermal conductivity in the height direction is 40 to 110 W/(m·K). When the 002 plane (c-axis) of the boron nitride particle is aligned with respect to the height direction of the boron nitride sintered body, it is further preferable that the bending strength measured from the height direction of the boron nitride sintered body is 10 to 40 MPa. Here, it is preferable that the thermal conductivity in the height direction is 10 to 40 W/(m·K).

<Evaluation Method of Bending Strength>

The bending strength of the boron nitride sintered body was measured under the conditions defined in JIS-R1601 at room temperature (25° C.). Here, "autograph AG2000D" available from Shimadzu Corporation was used. Measurement was conducted with the resin-impregnated boron nitride sintered body and the boron nitride molded body in a similar manner.

<Dielectric Breakdown Strength and Evaluation Method Thereof>

The dielectric breakdown strength of the resin-impregnated boron nitride sintered body of the present invention is preferably 15 kV/mm or higher. When the dielectric breakdown strength is lower than 15 kV/mm, electric insulation sufficient to be used as the heat dissipating member cannot be achieved, which is unfavorable. Measurement of the dielectric breakdown strength can be conducted by using "AC compression tester ITS-60005 (available from Tokyo-seiden.co.jp)". The measurement can be conducted in accordance with JIS-C2141, by processing the measurement samples to have a width of 50 mm, length of 50 mm, and thickness of 1.0 mm; in an insulating oil under room temperature (25° C.) with an electrode size of Φ25 mm.

<Thermal Conductivity>

Regarding the boron nitride sintered body structuring the resin-impregnated boron nitride sintered body of the present invention, the thermal conductivity is preferably 10 W/(m·K) or more. The thermal conductivity being less than 10 W/(m·K) indicates that the three-dimensional bonding strength of the flake-like boron nitride particles is weak, and thus the thermal conductivity of the resin-impregnated boron nitride sintered body decreases. Thermal conductivity can be adjusted by the addition amount of calcium compound, calcination temperature when the boron nitride sintered body is prepared, and the pressure when the boron nitride sintered body is applied with an isotropic pressure.

<Measuring Method of Thermal Conductivity>

Thermal conductivity (H: W/(m·K)) of boron nitride sintered body, boron nitride molded body and resin-impregnated boron nitride sintered body was calculated from thermal diffusivity (A: $m^2$/sec), density (B: $kg/m^3$), and specific heat capacity (C: J/(kg·K)), by the equation of H=A×B× C. Thermal diffusivity was obtained by the laser flash method with a measuring sample processed to have a width of 10 mm, length of 10 mm, and thickness of 1.0 mm. As the measuring apparatus, xenon flash analyzer ("LFA447 Nano Flash" available from NETZSCH Japan K.K.) was used. Density was obtained using the Archimedes method. Specific heat capacity was obtained using DSC ("ThermoPlus Evo DSC 8230" available from Rigaku Corporation).

<Shore Hardness and Evaluation Method Thereof>

Shore hardness of the resin-impregnated boron nitride sintered body of the present invention is preferably 25HS or lower. When the shore hardness exceeds the value of 25HS, the resin-impregnated boron nitride sintered body would become brittle, and thus the stress applied by tightening and pinching when the resin-impregnated boron nitride sintered body is mounted as the heat dissipating member would cause break in the resin-impregnated boron nitride sintered body. In addition, insufficient flexibility would increase the interface resistance, resulting in increase in the thermal resistance. Measurement of the shore hardness can be conducted by using, for example, "shore D hardness meter, available from Shimadzu Corporation". Measurement was conducted with the boron nitride sintered body and boron nitride molded body in a similar manner.

<Thermal Resistance and Evaluation Method Thereof>

When the resin-impregnated boron nitride sintered body is used as the heat dissipating member, the thermal resistance is preferably as small as possible. When the interface thermal resistance is large, the thermal conductivity calculated from the laser flash method and the like deviates largely from the thermal resistance when mounted. Here, the value of the thermal conductivity when mounted would become low. Further, regarding the grease applied to the interface with the substrate to relieve the interface thermal resistance, the amount of the grease, which decreases the thermal conductivity, can be suppressed by using a resin-impregnated boron nitride sintered body having low shore hardness and low interface thermal resistance. Measurement of the thermal resistance of the resin-impregnated boron nitride sintered body can be conducted in accordance with ASTM-D5470, and the value of the thermal resistance in the present measurement is a value including the thermal resistance of the bulk and the interface thermal resistance at the contacting plane. The size of the samples were 10 mm×10 mm, thickness was 0.3 mm, applied load was 9.8 kgf/cm$^3$, and the measurement was conducted greaseless.

<Purity of Boron Nitride and Evaluation Method Thereof>

In addition, the purity of boron nitride in the boron nitride sintered body and boron nitride model of the present invention is preferably 95 mass % or higher. The purity of boron nitride can be measured by alkalinolysis of the boron nitride powder, followed by steam distillation using Kjeldahl method, and then measurement of all of nitrogen contained in the distillate by neutralization titration.

<Definition of Average Grain Size of Boron Nitride Powder and Evaluation Method Thereof>

The average grain size of the boron nitride powder used as the starting material of the boron nitride sintered body is the grain size of accumulated value of 50% for accumulated particle distribution obtained in the particle size distribution measurement by the laser diffraction scattering method. As the size distribution measuring apparatus, "MT3300EX" (available from NIKKISO CO., LTD.) can be used. When the measurement was conducted, water was used as the solvent, hexametaphosphoric acid was used as the dispersant, and the boron nitride powder was dispersed using a homogenizer at 20 W output for 30 minutes as pretreatment. The refractive index of the water was taken as 1.33, and the refractive index of the boron nitride powder was taken as 1.80. The measurement period for one measurement was 30 seconds.

<Sintering Conditions of Boron Nitride Sintered Body>

The boron nitride sintered body of the present invention is manufactured preferably by preparing a spherical boron nitride powder by spheroidizing the slurry containing the boron nitride powder using a spray dryer and the like, and then filling the spherical boron nitride powder into a container of boron nitride and the like, followed by sintering at 1600° C. or higher for 1 hour or longer. When the sintering is not conducted, the pore size would be small, and it would be difficult to impregnate the resin. It is important to manufacture the boron nitride sintered body by conducting calcination at 1600° C. or higher for 1 hour or longer, in order to obtain the boron nitride sintered body having I.O.P. in a particular range. When the sintering temperature is lower than 1600° C., the crystallinity of the boron nitride would not be improved sufficiently, and thus the thermal conductivity of the resin-impregnated boron nitride sintered body may decrease. Although there is no particular limitation regarding the upper limit of the sintering temperature, an upper limit of approximately 2200° C. is practical, in economic terms of view. In addition, when the sintering period is shorter than 1 hour, the crystallinity of the boron nitride would not be improved sufficiently, and thus the thermal conductivity of the boron nitride sintered body may decrease. Although there is no particular limitation regarding the upper limit of the sintering period, an upper limit of approximately 30 hours is practical, in economic terms of view. In addition, sintering is preferably conducted under nitrogen or argon atmosphere in order to prevent oxidation of the boron nitride sintered body.

<Programming Rate During Manufacture of Boron Nitride Sintered Body>

In the sintering process of the boron nitride sintered body of the present invention, it is preferable that the programming rate in the temperature range of 300 to 600° C. is 40° C./min or lower. When the programming rate is higher than 40° C./min, rapid decomposition of the organic binder would cause a distribution in the sintering property of the boron nitride particles, thereby resulting in large variation in the properties and decrease in reliability. Although there is no particular limitation regarding the lower limit of the programming rate, a lower limit of approximately 5° C./min is practical, in economic terms of view.

<Heat Dissipating Member>

The heat dissipating member using the resin-impregnated boron nitride sintered body of the present invention is described. The heat dissipating member of the present invention is obtained in the following manner. Resin is impregnated in the boron nitride sintered body, followed by curing, thereby obtaining the resin-impregnated boron nitride sintered body. Subsequently, using a multi wire saw and the like, the resin-impregnated boron nitride sintered body is cut into a plate-shaped resin-impregnated boron nitride sintered body having arbitrary thickness. The plate-shaped resin-impregnated boron nitride sintered body is suitably used to manufacture the heat dissipating member of the present invention. By using a processing apparatus such as the multi wire saw and the like, the resin-impregnated boron nitride sintered body can be cut out with arbitrary thickness by mass amount, and the surface roughness after cutting would show a favorable value. In addition, by altering the direction of the resin-impregnated boron nitride sintered body when the cutting is conducted, a plate-shaped resin-impregnated boron nitride sintered body having superior thermal conductivity with respect to an arbitrary direction can be easily obtained.

<Increasing Density of Boron Nitride Sintered Body>

The boron nitride sintered body of the present invention is characteristic in that it is manufactured via a densification process by applying an isotropic pressure in order to improve the adhesion property of the flake-like boron nitride particles to improve the thermal conductivity. As the method for applying pressure, applying cold isotropic pressure using a CIP (cold isotropic pressing) machine can be mentioned for example. The boron nitride sintered body is sealed in a plastic bag and placed in a rubber mold, followed by application of pressure using the CIP machine. Preferable pressure is 1 to 300 MPa.

<Composite with Resin>

Next, the method for obtaining a composite of boron nitride sintered body and resin will be explained. The resin-impregnated boron nitride sintered body of the present invention is suitably manufactured by impregnating a resin in the boron nitride sintered body followed by curing. The resin can be impregnated by vacuum impregnating, pressurized impregnating at 1 to 300 MPa (preferably 3 to 300 MPa), heated impregnating at r.t. to 150° C., or combination thereof. The pressure during the vacuum impregnating is preferably 1000 Pa or lower, and more preferably 50 Pa or lower. With respect to pressurized impregnating, the resin would not sufficiently impregnate into the boron nitride sintered body when the pressure is lower than 1 MPa. On the other hand, when the pressure is 300 MPa or higher, the facility would become large, raising the cost. By decreasing the viscosity of the resin, the resin can be impregnated into the boron nitride sintered body. Therefore, it is further preferable to increase the temperature to a temperature range of 30 to 300° C. and to decrease the viscosity of the resin when pressure is applied.

<Resin>

As the resin, epoxy resin, silicone resin, silicone rubber, acrylic resin, phenol resin, melamine resin, urea resin, unsaturated polyester, fluorine resin, polyamide such as polyimide, polyamide imide, polyether imide and the like, polyester such as polybutylene terephthalate, polyethylene terephthalate and the like, polyphenylene ether, polyphenylene sulfide, fully aromatic polyester, polysulfone, liquid crystal polymer, polyether sulfone, polycarbonate, modified maleimide resin, ABS resin, AAS (acrylonitrile-acryl rubber styrene) resin, AES (acrylonitrile•ethylene•propylene•dine rubber-styrene) resin, polyglycolic acid resin, poly phthalimide, polyacetal and the like can be used for example. In particular, epoxy resin is suitable for the insulating layer of a printed-wiring board since its heat resistance and adhesion strength with respect to a copper foil circuit are superior. In addition, silicone resin is suitable as the thermal interface materials since heat resistance, flexibility and adhesion property with respect to a heat sink and the like are superior. These resins, especially thermosetting resin can contain curing agent, inorganic fillers, silane coupling agent, and further an additive to enhance the improvement in the wettability and leveling property and decrease in the viscosity, thereby decreasing occurrence of defects during hot-press molding. As the additive, for example, antifoaming agent, surface conditioner, wetting-and-dispersing agent and the like can be mentioned for example. In addition, it is further preferable that the resin contains one or more types of a ceramics powder selected from the group consisting of aluminum oxide, silicon oxide, zinc oxide, silicon nitride, aluminum nitride, and aluminum hydroxide. The ceramics powder can be filled in between the boron nitride particles, thereby allowing improvement of the thermal conductivity of the boron nitride resin mold. The resin and the ceramics powder containing resin can be diluted with a solvent as necessary. As the solvent, alcohols such as ethanol, isopropanol and the like, ether alcohols such as 2-methoxyethanol, 1-methoxyethanol, 2-ethoxyethanol, 1-ethoxy-2-propanol, 2-butoxyethanol, 2-(2-methoxyethoxy)ethanol, 2-(2-ethoxyethoxy)ethanol, 2-(2-butoxyethoxy)ethanol and the like, glycol ethers such as ethylene glycol monomethyl ether, ethylene glycol monobutyl ether and the like, ketones such as acetone, methyl ethyl ketone, methyl isobutyl ketone and di-isobutyl ketone, hydrocarbons such as toluene and xylene can be mentioned for example. Here, these diluents can be used alone or two or more types can be used in combination.

(Second Viewpoint)

The resin-impregnated boron nitride sintered body according to the second viewpoint of the present invention can obtain a heat dissipating member having superior thermal conductivity and small anisotropy of thermal conductivity, which cannot be achieved by the conventional technique, by using the resin-impregnated boron nitride sintered body containing a boron nitride sintered body and a resin. Here, in the boron nitride sintered body, accessibility among the boron nitride particles is enhanced by allowing the orientation degree of the boron nitride crystals to be small and by further allowing the flake-like boron nitride particles to bond three-dimensionally. Here, the flake-like boron nitride particles have specific calcium content and graphitization index of the boron nitride, and the average long diameter of the flake-like boron nitride is appropriately controlled.

The resin-impregnated boron nitride sintered body according to the second viewpoint of the present invention contains three-dimensionally bonded boron nitride sintered body by 30 to 90 volume %, and a resin by 10 to 70 volume %, and comprises flake-like boron nitride particles of which boron nitride sintered body has an average long diameter of 10 μm or more. In addition, the orientation degree represented by I.O.P. is 0.6 to 1.4, the calcium content is 500 to 5000 ppm, and the graphitization index obtained by the powder X-ray diffractometry is 0.8 to 4.0. The resin-impregnated boron nitride sintered body designed as such did not exist to date, and is a very important factor to retain high thermal conductivity and small anisotropy of thermal conductivity when used as a heat dissipating member.

The major difference compared with the conventional technique is that the resin-impregnated boron nitride sintered body according to the second viewpoint of the present invention is a boron nitride sintered body obtained by bonding boron nitride particles three-dimensionally by sintering. The meaning of the three-dimensional bonding is as explained in the first viewpoint. In addition, since the orientation degree of the boron nitride crystal was large in the conventional technique, there was a limit in decreasing the anisotropy of thermal conductivity.

<Orientation Degree>

In order to decrease the anisotropy of the thermal conductivity with respect to the resin-impregnated boron nitride sintered body, it is necessary to decrease the orientation degree of the boron nitride crystals. Regarding the boron nitride sintered body structuring the resin-impregnated boron nitride sintered body, the orientation degree represented by I.O.P. is 0.6 to 1.4. When I.O.P. is out of the range of 0.6 to 1.4, the boron nitride crystals are aligned in a specific direction, and thus the anisotropy of the thermal conductivity with respect to the resin-impregnated boron nitride sintered body becomes large. Orientation degree can be controlled by the formulation amount of the amorphous boron nitride powder and the hexagonal boron nitride powder particles as the raw material. Here, in general, I.O.P. of the boron nitride sintered body manufactured by conventional technique is 0.5 or lower and 2 or higher. The definitions of orientation degree and evaluation method thereof are as described in the first viewpoint.

<Content of Calcium and Evaluation Method Thereof>

In the resin-impregnated boron nitride sintered body according to the second viewpoint of the present invention, what is particularly important is that the calcium content of the boron nitride sintered body is 500 to 5000 ppm. When the calcium content is less than 500 ppm, the sintering of the boron nitride would not proceed sufficiently and forms a powder, and thus cannot be taken as the sintered body. When the calcium content is larger than 5000 ppm, the thermal conductivity of the resin-impregnated boron nitride sintered body would decrease. The range of the calcium content is more preferably 1000 to 4500 ppm. The calcium content can be measured by using a wavelength-dispersive X-ray fluorescence analysis device "ZSX Primus II (available from Rigaku Corporation)" for example. As a preliminary treatment before the measurement, the boron nitride sintered body is crushed using an agate mortar, and then the boron nitride powder thus obtained was press molded. When the measurement was conducted, Rh vacuum tube was used as the X-ray tube, the electric power of the X-ray tube was 3.0 kW, and measuring diameter was Φ=30 mm. Measurement was conducted with the boron nitride molded body in a similar manner.

EXAMPLES

Hereinafter, the present invention will be described specifically with reference to Examples and Comparative Examples.
(First Viewpoint)
<Preparation of Boron Nitride Sintered Body>
Amorphous boron nitride powder (oxygen content of 1.5%, boron nitride purity of 97.6%, average grain size of 6.0 μm) and hexagonal boron nitride powder (oxygen content of 0.3%, boron nitride purity of 99.0%, average grain size of 18.0 μm or 30.0 μm) were mixed using a Henschel mixer, to give a mixed powder. Subsequently, the mixed powder for molding was used to conduct press molding at 5 MPa to give a block molded body. The block molded body thus obtained was sintered in a batch-type high-frequency furnace with a nitrogen flow of 10 L/min, thereby obtaining a boron nitride sintered body. In some of the experimental conditions, pressure treatment was performed with a pressure ranging in 10 to 100 MPa, by a cold isotropic pressing method (CIP).
<Vacuum Impregnation of Epoxy Resin>
The resin was impregnated into the boron nitride sintered body thus obtained. A mixture of the boron nitride sintered body and epoxy resin ("bond E205" available from Konishi Co., Ltd) with an attached curing agent was degassed under vacuum of 50 Pa for 10 minutes, and was then poured into the boron nitride sintered body under vacuum, followed by impregnation for 20 minutes. Subsequently, the resin was cured by heating at 150° C. for 60 minutes, thereby obtaining the resin-impregnated boron nitride sintered body.
<Preparation of Plate-Shaped Resin-Impregnated Boron Nitride Sintered Body>
To evaluate the properties of the resin-impregnated boron nitride sintered body obtained as the heat dissipating member, the resin-impregnated boron nitride sintered body was processed into an arbitrary shape using a multi wire saw or a machining center. Here, the resin-impregnated boron nitride sintered body was cut out so that the 100 plane (a-axis) or the 002 plane (c-axis) would align with respect to the thickness direction. In addition, the resin-impregnated boron nitride sintered body thus obtained was calcinated in air at 1000° C. for 1 hour, thereby calcifying the resin component to obtain the boron nitride molded body. The results of the evaluation for the boron nitride sintered body and the resin-impregnated boron nitride sintered body are shown in Table 1-1 to Table 1-2.

The boron nitride sintered body and the boron nitride molded body were the same in the average long diameter of the boron nitride particles, alignment of the 100 plane (a-axis) or the 002 plane (c-axis) of the boron nitride particles with respect to the height direction, porosity, I.O.P., graphitization index by powder X-ray diffractometry, and shore hardness.

Here, regarding the boron nitride sintered body and the boron nitride molded body, bending strength and thermal conductivity measured with respect to the height direction when the 100 plane (a-axis) of the boron nitride particles were aligned with respect to the height direction; and bending strength and thermal conductivity measured with respect to the height direction when the 002 plane (c-axis) of the boron nitride particles were aligned with respect to the height direction; were the same.

TABLE 1-1

| | boron nitride sintered body | | | | | | | | | |
|---|---|---|---|---|---|---|---|---|---|---|
| condition | sinteration | alignment | I.O.P. | graphitization index | average diameter (μm) | porosity (%) | CIP pressure MPa | thermal conductivity in height direction W/(m · K) | shore hardness in height direction HS | bending strength in height direction MPa | type |
| 1A | conducted | a-axis | 0.042 | 1.1 | 20 | 33 | 100 | 93.2 | 9.0 | 8.8 | Example |
| 1C | conducted | a-axis | 0.023 | 1.1 | 18 | 51 | 20 | 55.8 | 6.5 | 4.9 | Example |
| 1G | none | a-axis | 0.039 | 4.2 | 10 | 67 | 10 | 8.0 | 11.0 | 9.1 | Comparative Example |
| 1I | conducted | a-axis | 0.042 | 1.1 | 20 | 91 | 0 | not available | not available | not available | Comparative Example |
| 1B | conducted | c-axis | 23.81 | 1.1 | 20 | 33 | 100 | 30.2 | 11.0 | 27.4 | Example |
| 1D | conducted | c-axis | 42.00 | 1.1 | 18 | 52 | 20 | 20.5 | 6.0 | 12.2 | Example |
| 1E | conducted | c-axis | 76.92 | 0.8 | 30 | 65 | 100 | 33.2 | 5.1 | 10.5 | Example |
| 1F | conducted | c-axis | 32.26 | 3.7 | 12 | 15 | 100 | 13.5 | 10.2 | 39.8 | Example |
| 1H | none | c-axis | 25.00 | 3.5 | 7 | 13 | 100 | 10.7 | 8.3 | 8.8 | Comparative Example |
| 1J | conducted | none | 1.000 | 2.2 | 22 | 70 | 0 | 9.5 | 7.0 | 10.0 | Comparative Example |

TABLE 1-2

| | resin-impregnated boron nitride sintered body | | | | | | |
|---|---|---|---|---|---|---|---|
| condition | boron nitride sintered body volume % | resin volume % | thermal conductivity in height direction W/(m · K) | shore hardness in height direction HS | bending strength in height direction MPa | thermal resistance ° C./W | Type |
| 1A | 70% | 30% | 94.4 | 19.5 | 26.0 | 0.279 | Example |
| 1C | 51% | 49% | 57.6 | 17.0 | 23.2 | 0.348 | Example |

TABLE 1-2-continued resin-impregnated boron nitride sintered body

| condition | boron nitride sintered body volume % | resin volume % | thermal conductivity in height direction W/(m · K) | shore hardness in height direction HS | bending strength in height direction MPa | thermal resistance ° C./W | Type |
|---|---|---|---|---|---|---|---|
| 1G | 90% | 10% | 8.3 | 11.0 | 9.3 | 1.364 | Comparative Example |
| 1I | 10% | 90% | 1.0 | 40.0 | 45.0 | 3.474 | Comparative Example |
| 1B | 76% | 24% | 31.9 | 19.3 | 66.3 | 0.376 | Example |
| 1D | 45% | 55% | 22.1 | 23.5 | 41.2 | 0.455 | Example |
| 1E | 34% | 66% | 35.9 | 12.1 | 35.5 | 0.315 | Example |
| 1F | 85% | 15% | 14.5 | 14.5 | 43.0 | 0.561 | Example |
| 1H | 94% | 6% | 10.9 | 9.0 | 9.1 | 0.781 | Comparative Example |
| 1J | 19% | 81% | 10.5 | 35.0 | 22.0 | 1.785 | Comparative Example |

As obvious from the comparison between the Examples and the Comparative Examples, the heat dissipating member using the plate-shaped resin-impregnated boron nitride sintered body according to the first viewpoint of the present invention has high thermal conductivity and high bending strength, thereby showing superior properties.

(Second Viewpoint)

<Preparation of Boron Nitride Sintered Body>

Amorphous boron nitride powder, hexagonal boron nitride powder, and calcium carbonate ("PC-700" available from Shiraishi Kogyo Kaisha, Ltd.) were mixed using a Henschel mixer, followed by addition of water. Subsequently, the mixture was crushed using a ball mill for 5 hours to give an aqueous slurry. Then, to the aqueous slurry, polyvinyl alcohol resin ("Gohsenol" available from The Nippon Synthetic Chemical Industry Co., Ltd.) was added by 0.5 mass %, followed by agitation with heating at 50° C. until dissolved. Subsequently, spheroidizing treatment was carried out at a drying temperature of 230° C. using a spray dryer. Here, as the spheroidizing apparatus of the spray dryer, rotary atomizer was used. The resulting material thus obtained was filled in a boron nitride container, followed by atmospheric pressure sintering using a batch-type high-frequency furnace with a nitrogen flow of 5 L/min. Then, the sintered body was taken out from the boron nitride container to obtain the boron nitride sintered body. Subsequently, CIP was used to pressurize the boron nitride sintered body under prescribed conditions to conduct densification. As shown in Table 2-1, average grain size of boron nitride powder, formulation ratio, spray drying conditions, calcination conditions, and CIP pressurizing conditions were adjusted to prepare 17 types of boron nitride sintered body.

TABLE 2-1

| condition | average diameter of boron nitride powder (μm) amorphous BN | average diameter of boron nitride powder (μm) hexagonal BN | formulation ratio (mass %) amorphous BN | formulation ratio (mass %) hexagonal BN | formulation ratio (mass %) CaCO₃ | formulation ratio (mass %) water | spray drying condition rotation number of atomizer (rpm) | calcination temperature (° C.) | CIP pressure (MPA) |
|---|---|---|---|---|---|---|---|---|---|
| 2A |  | 10.1 | 17.50 | 7.50 | 0.47 | 74.53 | 9000 | 2000 | 10 |
| 2B | 1.5 | 6.5 | 17.50 | 7.50 | 0.47 | 74.53 | 9000 | 2000 | 10 |
| 2C | 3.4 | 10.1 | 12.75 | 2.25 | 0.64 | 84.36 | 9000 | 2100 | 10 |
| 2D | 3.4 | 10.1 | 15.40 | 12.60 | 0.52 | 71.48 | 9000 | 2000 | 10 |
| 2E | 3.4 | 10.1 | 17.50 | 7.50 | 0.12 | 74.88 | 9000 | 2000 | 10 |
| 2F | 3.4 | 10.1 | 17.50 | 7.50 | 0.81 | 74.19 | 9000 | 2000 | 10 |
| 2G | 3.4 | 10.1 | 17.50 | 7.50 | 0.37 | 74.63 | 9000 | 1700 | 10 |
| 2H | 3.4 | 10.1 | 17.50 | 7.50 | 0.47 | 74.53 | 9000 | 2000 | 5 |
| 2I | 3.4 | 10.1 | 17.80 | 7.50 | 0.47 | 74.53 | 9000 | 2000 | 100 |
| 2J | 1.1 | 3.2 | 17.50 | 7.50 | 0.47 | 74.53 | 9000 | 1700 | 10 |
| 2K | 3.4 | 10.1 | 23.75 | 1.25 | 0.47 | 74.53 | 9000 | 2200 | 10 |
| 2L | 3.4 | 10.1 | 3.30 | 29.70 | 0.62 | 66.38 | 9000 | 2000 | 10 |
| 2M | 3.4 | 10.1 | 17.50 | 7.50 | 0.08 | 74.92 | 9000 | 2000 | 10 |
| 2N | 3.4 | 10.1 | 17.50 | 7.50 | 1.12 | 73.88 | 9000 | 2000 | 10 |
| 2O | 3.4 | 10.1 | 17.00 | 7.50 | 0.47 | 74.53 | 9000 | 1500 | 10 |
| 2P | 3.4 | 10.1 | 5.00 | 20.00 | 1.12 | 73.88 | 9000 | 2200 | 500 |
| 2Q | 3.4 | 10.1 | 17.50 | 7.50 | 0.47 | 74.53 | 9000 | 2000 | CIP not performed |

Impregnation of Epoxy Resin, Examples 2-1 to 2-9 and Comparative Examples 2-1 to 2-8

Resin impregnation was conducted with the boron nitride sintered body thus obtained. A mixture of boron nitride sintered body, epoxy resin ("Epikote 807" available from Mitsubishi Chemical Corporation) and curing agent ("Akumex H-84B" available from Nihon Gosei Kako Co., Ltd.) was degassed under vacuum of 50 Pa for 20 minutes, and then the epoxy resin mixture was poured into the boron nitride sintered body under vacuum, followed by 30 minutes of impregnation. Then, nitrogen gas was used to pressurize with a pressure of 3 MPa at 120° C. for 30 minutes, thereby impregnating and curing the resin to obtain the resin-impregnated boron nitride sintered body.

Impregnation of Silicone Resin, Example 2-10

Boron nitride sintered body and silicone resin ("YE5822" available from Momentive Performance Materials Inc.) were degassed under vacuum of 50 Pa for 20 minutes, and then the silicone resin was poured into the boron nitride sintered body under vacuum, followed by 30 minutes of impregnation. Then, nitrogen gas was used to pressurize with a pressure of 3 MPa at 20° C. for 30 minutes, thereby impregnating the resin. Subsequently, the material was heated using a drying apparatus at 150° C. for 60 minutes to obtain the resin-impregnated boron nitride sintered body.

The resin-impregnated boron nitride sintered body thus obtained was calcinated at 1000° C. for 1 hour under air, thereby calcifying the resin component to obtain the boron nitride molded body. The evaluation results of the boron nitride sintered body and the resin-impregnated boron nitride sintered body obtained for the Examples and Comparative Examples are shown in Table 2-2 and Table 2-3. Here, when the sintering of the boron nitride sintered body was insufficient and thus resulted in a powder, the boron nitride sintered body could not be taken out from the boron nitride container. In such case, the result was shown as "unable to take out due to powdering".

Regarding the boron nitride sintered body and the boron nitride molded body, the average long diameter of the boron nitride particles, porosity, I.O.P., graphitization index by powder X-ray diffractometry, and calcium content were the same.

Here, regarding the boron nitride sintered body and the boron nitride molded body, bending strength and thermal conductivity measured with respect to the height direction when the 100 plane (a-axis) of the boron nitride particles were aligned with respect to the height direction; and bending strength and thermal conductivity measured with respect to the height direction when the 002 plane (c-axis) of the boron nitride particles were aligned with respect to the height direction; were the same.

TABLE 2-2

| | | boron nitride sintered body | | | | | | | |
|---|---|---|---|---|---|---|---|---|---|
| | condition | average grain size of flake-like boron nitride particles (μm) | I.O.P. | calcium content (ppm) | GI (-) | total porosity (%) | bending strength (MPa) | thermal conductivity in height direction (W/mK) | comments |
| Example 2-1 | 2A | 17 | 1.1 | 1960 | 1.6 | 45 | 12 | 34 | — |
| Example 2-2 | 2B | 11 | 1.0 | 2050 | 1.6 | 45 | 17 | 24 | — |
| Example 2-3 | 2C | 20 | 0.7 | 1730 | 0.9 | 42 | 18 | 27 | — |
| Example 2-4 | 2D | 16 | 1.4 | 1890 | 1.6 | 46 | 10 | 39 | — |
| Example 2-5 | 2E | 13 | 0.9 | 560 | 1.6 | 44 | 8 | 24 | — |
| Example 2-6 | 2F | 17 | 0.8 | 4450 | 1.6 | 47 | 18 | 28 | — |
| Example 2-7 | 2G | 18 | 0.9 | 2210 | 3.7 | 43 | 9 | 22 | — |
| Example 2-8 | 2H | 18 | 1.0 | 1940 | 1.6 | 61 | 10 | 27 | — |
| Example 2-9 | 2I | 16 | 1.0 | 1910 | 1.6 | 30 | 35 | 48 | — |
| Example 2-10 | 2A | 17 | 1.1 | 1960 | 1.6 | 45 | 12 | 31 | — |
| Comparative Example 2-1 | 2J | 5 | 0.9 | 2010 | 3.1 | 46 | 10 | 9 | — |
| Comparative Example 2-2 | 2K | 27 | 0.4 | 1240 | 0.7 | 45 | 22 | 9 | — |
| Comparative Example 2-3 | 2L | 25 | 1.8 | 1510 | 1.6 | 44 | 7 | 41 | — |
| Comparative Example 2-4 | 2M | — | — | — | — | — | — | — | unable to take out due to powdering |
| Comparative Example 2-5 | 2N | 17 | 1.2 | 5850 | 1.3 | 45 | 22 | 14 | — |
| Comparative Example 2-6 | 2O | 15 | 0.8 | 2340 | 4.5 | 43 | 3 | 4 | — |
| Comparative Example 2-7 | 2P | 26 | 0.5 | 5610 | 0.7 | 14 | 44 | 18 | — |
| Comparative Example 2-8 | 2Q | 17 | 1.0 | 1990 | 2.0 | 73 | 6 | 11 | — |

TABLE 2-3

| | | resin-impregnated boron nitride sintered body | | | | | | |
|---|---|---|---|---|---|---|---|---|
| | resin | boron nitride (volume %) | resin (volume %) | thermal conductivity in height direction W/(m · K) | thermal conductivity in planar direction W/(m · K) | ratio of thermal conductivity (height/plane) | dielectric breakdown strength KV/mm | comments |
| Example 2-1 | epoxy | 55 | 45 | 33 | 31 | 1.06 | 22 | — |
| Example 2-2 | epoxy | 55 | 45 | 22 | 20 | 1.10 | 20 | — |
| Example 2-3 | epoxy | 58 | 42 | 25 | 31 | 0.81 | 20 | — |
| Example 2-4 | epoxy | 54 | 46 | 37 | 31 | 1.19 | 23 | — |
| Example 2-5 | epoxy | 56 | 44 | 24 | 26 | 0.92 | 24 | — |
| Example 2-6 | epoxy | 53 | 47 | 27 | 31 | 0.87 | 21 | — |
| Example 2-7 | epoxy | 57 | 43 | 23 | 26 | 0.88 | 23 | — |
| Example 2-8 | epoxy | 39 | 61 | 28 | 27 | 1.04 | 23 | — |
| Example 2-9 | epoxy | 70 | 30 | 44 | 46 | 0.96 | 16 | — |
| Example 2-10 | silicone | 55 | 45 | 30 | 27 | 1.11 | 26 | — |
| Comparative Example 2-1 | epoxy | 54 | 46 | 8 | 10 | 0.80 | 23 | — |
| Comparative Example 2-2 | epoxy | 55 | 45 | 8 | 34 | 0.24 | 21 | — |
| Comparative Example 2-3 | epoxy | 56 | 44 | 38 | 8 | 4.75 | 20 | — |
| Comparative Example 2-4 | epoxy | 55 | 45 | — | — | — | — | unable to take out due to powdering |
| Comparative Example 2-5 | epoxy | 55 | 45 | 14 | 11 | 1.27 | 20 | — |
| Comparative Example 2-6 | epoxy | 57 | 43 | 4 | 6 | 0.67 | 26 | — |
| Comparative Example 2-7 | epoxy | 86 | 14 | 16 | 41 | 0.39 | 11 | — |
| Comparative Example 2-8 | epoxy | 27 | 73 | 11 | 10 | 1.10 | 25 | — |

As obvious from the comparison between the Examples and the Comparative Examples, the heat dissipating member using the resin-impregnated boron nitride sintered body according to the second viewpoint of the present invention has high thermal conductivity and small anisotropy of thermal conductivity.

INDUSTRIAL APPLICABILITY

The heat dissipating member using the resin-impregnated boron nitride sintered body of the present invention can be suitably used as the heat dissipating member of the exothermic electronic parts such as power devices and the like. In particular, it can be used for the insulating layer and thermal interface materials of a printed-wiring board and for the double-side heat dissipating power modules for automobiles.

While illustrative embodiments have been illustrated and described, it will be appreciated that various changes can be made therein without departing from the spirit and scope of the invention.

The embodiments of the invention in which an exclusive property or privilege is claimed are defined as follows:

1. A resin-impregnated boron nitride sintered body, comprising:
   30 to 90 volume % of a boron nitride sintered body having boron nitride particles bonded three-dimensionally; and
   10 to 70 volume % of a resin; wherein:
   the boron nitride sintered body has a calcium content of 500 to 5000 ppm;
   the boron nitride sintered body has a graphitization index (GI) by powder X-ray diffractometry of 0.8 to 4.0;
   the boron nitride sintered body comprises flake-like boron nitride particles having an average long diameter of 10 μm or more; and
   an orientation degree by I.O.P (The Index of Orientation Performance) is 0.6 to 1.4, the orientation degree obtained from an intensity ratio of (100) diffraction line with respect to (002) diffraction line measured from a direction parallel to a height direction of the boron nitride sintered body and an intensity ratio of (100) diffraction line with respect to (002) diffraction line measured from a direction perpendicular to the height direction of the sintered body, using the following equation:

$$I.O.P = (I100/I002)par./(I100/I002)prep.$$

2. The resin-impregnated boron nitride sintered body of claim 1, wherein:
   the boron nitride sintered body having the boron nitride particles bonded three-dimensionally has a three-point bending strength of 5 to 40 MPa, a thermal conductivity of 5 W/(m·K) or more, and a total porosity of 70% or less.

3. The resin-impregnated boron nitride sintered body of claim 1, wherein the resin is a thermosetting resin.

4. A heat dissipating member comprising the resin-impregnated boron nitride sintered body of claim 1.

5. A substrate for power module comprising the heat dissipating member of claim 4.

6. A double-side heat dissipating power module for automobiles comprising the heat dissipating member of claim 4.

* * * * *